United States Patent [19]

Yamagata et al.

[11] Patent Number: 4,870,620
[45] Date of Patent: Sep. 26, 1989

[54] DYNAMIC RANDOM ACCESS MEMORY DEVICE WITH INTERNAL REFRESH

[75] Inventors: Tadato Yamagata; Hiroshi Miyamoto; Michihiro Yamada; Shigeru Mori; Tetsuya Aono, all of Hyogo, Japan

[73] Assignee: Mitsubishi Denki Kabushiki Kaisha, Tokyo, Japan

[21] Appl. No.: 141,076

[22] Filed: Jan. 5, 1988

[30] Foreign Application Priority Data

Jan. 6, 1987 [JP] Japan ................................ 62-842
Jul. 17, 1987 [JP] Japan ............................ 62-179361

[51] Int. Cl.$^4$ .................... G11C 7/00; G11C 11/40
[52] U.S. Cl. ........................ 365/222; 365/230.08; 365/189.11; 365/226
[58] Field of Search ............... 365/222, 189, 226, 230

[56] References Cited

U.S. PATENT DOCUMENTS

| | | | |
|---|---|---|---|
| 4,207,618 | 6/1980 | White, Jr. et al. | 365/222 |
| 4,570,242 | 2/1986 | Nagami | 365/222 |
| 4,628,482 | 12/1986 | Tachiuchi et al. | 365/222 X |
| 4,631,701 | 12/1986 | Kappeler et al. | 365/222 X |
| 4,677,592 | 6/1987 | Sakurai et al. | 365/222 |
| 4,682,306 | 7/1987 | Sakurai et al. | 365/222 |

OTHER PUBLICATIONS

Eaton, S. Sheffield, IEEE International Solid State Conference, "A 5V-only 2Kx8 Dynamic Ram", Feb. 15, 1987, pp. 144–145.
Ford, David C. et al, Electronics, "64-K Dynamic RAM Has Pin That Refreshes", Feb. 15, 1979, pp. 141–147.

Primary Examiner—Stuart N. Hecker
Assistant Examiner—Alyssa H. Bowler
Attorney, Agent, or Firm—Lowe, Price, LeBlanc, Becker & Shur

[57] ABSTRACT

The switching circuit 4 receives external address signals EXT. $A_0$ to $A_8$ or output signals $Q_0$ to $Q_8$ from the refresh counter 2 and selects either of these signals in response to the clock signals $\phi_2$ and $\overline{\phi_2}$ to apply the same to the address buffer 1. A plurality of N type field effect transistors, which operate in response to the clock signal $\phi_3$, such as transistors 540, 54 and 548 are connected between each of the inputs of the switching circuit 4 for receiving the external address signals EXT. $A_0$ to $A_8$ and the ground $V_{ss}$. Referring to the i-th circuit portion, before the switching circuit 4 applies a signal $Q_i$ from the refresh counter 2 to the address buffer 1, the transistor 54 turns on in response to the clock signal $\phi_3$ and brings the input of the address buffer 1 to the voltage level of the ground $V_{ss}$. When the switching circuit 4 is switched, the signal from the refresh counter 2 is correctly applied to the address buffer 1. Therefore, malfunctions of the address buffer 1 can be prevented.

26 Claims, 6 Drawing Sheets

DYNAMIC RANDOM ACCESS MEMORY DEVICE WITH INTERNAL REFRESH

BACKGROUND OF THE INVENTION

1. Field of the Invention

The present invention relates to a dynamic random access memory device having a self-refresh function and, more specifically, it relates to a random access memory device capable of performing a self-refresh operation without a malfunction.

2. Description of the Prior Art

FIG. 1A is a block diagram showing an example of a simplified circuit of a conventional 1 M bit dynamic RAM (Random Access Memory) having 1048576 memory cells. Referring to FIG. 1A, a summary of the basic operation of the dynamic RAM and the "$\overline{CAS}$ before $\overline{RAS}$ Refresh" function in relation to the present invention will be hereinafter described.

A clock generator 151 receives an $\overline{RAS}$ (Row Address Strobe) signal, $\overline{CAS}$ (Column Address Strobe) signal and $\overline{WE}$ (Write Enable) signal from a CPU (Central Processing Unit) and generates clock signals $\phi_0$ and $\phi_1$. In the normal read/write operation of the dynamic RAM, an address buffer 1 receives external address signals EXT. $A_0$ to $A_9$ on a time share basis through a switching circuit 4 and applies internal address signals $A_0$ to $A_8$ on a time share basis to a row decoder 155 and a column decoder 156. The row decoder 155 and the column decoder 156 decode the internal address signals $A_0$ to $A_8$ and apply the decoded signals to a memory cell array 158 and an I/O gates 157. The writing operation of the input data $D_{IN}$ and the reading operation of the output data $D_{OUT}$ are carried out for a memory cell having the address designated as described above. An input buffer 159 receives the input data $D_{IN}$ and transfers the input data $D_{IN}$ to the memory cell array 158 via the I/0 gates 157 and the sense amplifiers 163 in response to a clock signal $\phi_3$. On the other hand, the output buffer 160 receives the data from the memory cell array 158 via the sense amplifiers 163 and the I/O gates 157 and outputs the output data $D_{OUT}$ in response to the clock signal $\phi_3$.

In the dynamic RAM, as is generally known, the reading and rewriting operation of all the memory cells, that is, the refresh operation, is carried out during the intervals of the above described usual read/write operation. Referring to FIG. 1A, in a refresh operation a refresh controller 152 generates a driving signal T for driving a refresh counter 2 in response to a clock signal $\phi_0$ from the clock generator 151. The refresh counter 2 receives the driving signal T and performs count operation and applies the output signals $Q_0$ to $Q_8$ to the address buffer 1 through the switching circuit 4. The address buffer 1 receives the output signals $Q_0$ to $Q_8$ of the refresh counter 2 instead of the external address signals EXT. $A_0$ to $A_8$ through the switching circuit 4 and applies the same as the internal address signals $A_0$ to $A_8$ to the row decoder 155. In the memory cell array 158, the reading operation of already written data and the rewriting operation are carried out successively for the memory cells having the addresses designated by the internal address signals $A_0$ to $A_8$. Since the refresh counter 2 successively outputs the output signals, the refresh of all memory cells can be accomplished by the repetition of the above described operation.

As described above, the method for performing refreshing, in which the signals for refreshing are not applied externally as the external address signals EXT. $A_0$ to EXT. $A_9$ but the signals are generated by the refresh counter 2 provided in the chip, is called "$\overline{CAS}$ before $\overline{RAS}$ Refresh", which is an almost standard function of a dynamic RAM.

In the block diagram of the dynamic RAM shown in FIG. 1A, the switching circuit 4 selects either the external address signals EXT. $A_0$ to EXT $A_8$ or the output signals $Q_0$ to $Q_8$ of the refresh counter 2 in response to the clock signals $\phi_2$ and $\overline{\phi_2}$ and applies the same to the address buffer 1.

Publications concerning the dynamic RAMs having the above described internal refresh function are seen in the paper of S. S. Eaton et al. in IEEE International Solid-State Circuits Conference held on February 15, 1979 and in the article of D. C. Ford et al. recited in ELECTRONICS published on Feb. 15, 1979.

An application of the prior art of particular interest to the present application concerning a dynamic memory device having internal refresh function is seen in U.S. Pat. No. 4,207,618 entitled "ON-CHIP REFRESH FOR DYNAMIC MEMORY", issued to L. S. White, Jr. et al. on June 10, 1980.

As described above, the operation state of the dynamic RAM comprises the normal read/write operation stat, "$\overline{CAS}$ before $\overline{RAS}$ Refresh" operation state and, further a standby state which is the state other than the above mentioned two operation states of the dynamic RAM. These three states are specified by the $\overline{RAS}$ signal and the $\overline{CAS}$ signal.

FIG. 1B is a timing chart showing the relation between the $\overline{RAS}$ signal, $\overline{CAS}$ signal and other signals and the three states of the dynamic RAM. Referring to FIG. 1B, the clock signals $\phi_2$ and $\overline{\phi_2}$ are the signals required for the operation of the switching circuit 4 and they are applied to the switching circuit 4 from the clock generator 151 through the refresh controller 152.

Referring to the timing chart of FIG. 1B, when the $\overline{RAS}$ signal and the $\overline{CAS}$ signal simultaneously become high level, the dynamic RAM is in the standby state. On this occasion, the clock signals $\phi_2$ and $\overline{\phi_2}$ have the voltages of low level and high level, respectively. Meanwhile when the $\overline{CAS}$ signal becomes low level and thereafter the $\overline{RAS}$ signal becomes low level, the "$\overline{CAS}$ before $\overline{RAS}$ Refresh" operation starts in the dynamic RAM. On this occasion both inverted clock signals $\phi_2$ and $\overline{\phi_2}$ are applied to the switching circuit 4. When the dynamic RAM is in the standby state initially, and the $\overline{CAS}$ signal becomes low level after the $\overline{RAS}$ signal becomes low level, the normal read/write operation of the dynamic RAM starts. When the $\overline{RAS}$ signal is at the low level, it is called the activated state.

FIG. 2A is a schematic diagram showing the conventional switching circuit 4 and the peripheral circuits thereof shown in FIG. 1A. FIG. 2A comprises nine circuit portions having similar connections. In the following, the description will be made only of the i-th circuit portion for the simplicity of the description, and the description can be applied to other circuit portions.

Referring to FIG. 2A, an input terminal 9 for receiving the i-th external address signal EXT. Ai is connected to one input of the switching circuit 4 through an n type field effect transistor 3. A clock signal $\phi_1$ is applied to the gate of the transistor 3 from the clock generator. The clock signal $\phi_1$ becomes high level in the standby state. The refresh counter 2 is connected to the other input of the switching circuit 4. The output of the switching circuit 4 is connected to the address buffer 1. The switching circuit 4 comprises an n type field effect transistor 40 connected to the transistor 3 and an n type field effect transistor 41 connected to the refresh counter 2. The node of the transistors 40 and 41 constitute the output of the switching circuit 4. A clock signal $\phi_2$ is applied to the gate of the transistor 41 and the inverted signal $\bar{\phi}_2$ of the clock signal $\phi_2$ is applied to the gate of the transistor 40, respectively. The clock signals $\phi_2$ and $\bar{\phi}_2$ are applied to the transistors 40 and 41 both from the clock generator through the refresh controller. In the refresh counter 2, a series connection in the output stage of the n type field effect transistors 20 and 21 connected between the power supply $V_{cc}$ and the ground $V_{ss}$ is schematically shown. In the address buffer 1, an n type MOS field effect transistor 10 in the input stage and a capacitor 11 for holding voltage are schematically shown. The address buffer 1 outputs the i-th internal address signal $A_i$ out of 0 to 9 and the inverted signal thereof, $\bar{A_i}$. $V_b$ denotes the voltage of the input of the address buffer 1. $Q_i$ is the i-th output signal of the refresh counter 2.

In the circuit of FIG. 2A, the switching circuit 4 selectively applies either the external address signal EXT. Ai or the output signal $Q_i$ of the refresh counter 2 to the input of the address buffer 1 in response to the clock signals $\phi_2$ and $\bar{\phi}_2$.

The operation will be described. In the following, the supply level of the voltage will be described as the H level while the ground level of the voltage will be described as the L level.

FIG. 2B is a timing chart showing the changes in each of the signals in the i-th circuit portion of the circuit shown in FIG. 2A. Referring to FIG. 2B, at time $t_1$, the clock signal $\phi_1$ is at the H level, the clock signal $\phi_2$ is at the L level and the clock signal $\bar{\phi}_2$ is at the H level, so that the external address signal EXT. Ai is applied to the input of the address buffer 1 through the transistor 40 of the switching circuit 4. At time $t_1$, let us assume that the voltage of the external address signal EXT. Ai is 0 volt. The input of the address buffer 1 is brought to the voltage of 0 volt (reference should be made to the waveform of $V_b$ in FIG. 2B). At time $t_2$, when the clock signal $\phi_2$ changes to the H level and the clock signal $\bar{\phi}_2$ changes to the L level, the transistor 40 turns off in response to the clock signal $\bar{\phi}_2$ while the transistor 41 turns on in response to the clock signal $\phi_2$. Therefore, the input of the address buffer 1 receives the output signal $Q_i$ of the refresh counter 2 instead of the external address signal EXT. Ai through the switching circuit 4. At time $t_2$, when the output signal $Q_i$ of the refresh counter 2 is at the H level, the input voltage $V_b$ of the address buffer 1 begins to rise (reference should be made to the waveform of $V_b$ of FIG. 2B). At time $t_3$, the address buffer 1 starts the operation. At time $t_3$, the input of the address buffer 1 receives the H level output 15 signal from the refresh counter 2 and is brought to the voltage near $V_b = V_{cc} - V_{th}$, where $V_{cc}$ is the supply voltage and $V_{th}$ is the value of the larger one of the threshold voltages of the transistors 20 and 41.

In the preceding paragraph, it was assumed that at time $t_1$, that EXT. $A_i$ was at zero volts. However, since EXT. A is an externally applied signal, in practice, EXT. A, can assume a lower voltage representing the low logic level. This is because the external circuit supplying EXT. A, may be operated at a slightly different supply voltage or the signal may contain noise. Such an occurrence is well-recognized and memories are commonly rated at a −1.0 to −2.0 volt lower limit to be recognized as a low logic level.

Accordingly, at time $t_1$, let us assume that the voltage of the external address signal EXT. Ai is for example −2.0 volt, which is the lowest voltage enabling the external address signal EXT. Ai to be recognized as the logic low level. The input of the address buffer 1 is brought to the voltage of −2.0 volt (reference should be made to the dotted line in FIG. 2B). After the time $t_2$, in the similar manner as described above, the input of the address buffer 1 is brought to the voltage near $V_b = V_{cc} - V_{th}$ in response to the H level output signal from the refresh counter 2. However, sometimes the input voltage $V_b$ of the address buffer 1 is not brought to the voltage which can be recognized by the address buffer 1 as the logic high level at the time $t_3$, that is, the time when the address buffer 1 begins the operation. As a result, since the address buffer 1 can not receive the correct signal from the refresh counter 2, the "$\overline{CAS}$ before $\overline{RAS}$ Refresh" operation, for example, is not carried out correctly.

The capacitor 11 of the address buffer 1 is to maintain the voltage of the external address signal EXT. Ai applied to the input of the address buffer 1. Namely, when the voltage of the external address signal EXT. Ai is applied to the input of the address buffer 1, the capacitor 11 is charged. Thereafter, the transistor 3 turns off in response to the clock signal $\phi_1$ and the input of the address buffer 1 is brought to the floating state. The capacitor 11 continues to apply the charged voltage to the gate of the transistor 10 during the operation of the address buffer 1. Therefore, the external address signal EXT. Ai need not be continuously applied to the input terminal 9.

SUMMARY OF THE INVENTION

Therefore, a main object of the present invention is to provide a dynamic random access memory device capable of operating the refresh counter means without malfunctioning by correctly transmitting the signals from the refresh counter means to the address buffer means.

Briefly stated, the present invention comprises selective output means having one input connected to receive the signals applied to the external address input and other input connected to receive the signals from the refresh counter means for selectively outputting either of the signals to the address buffer means connected to the output thereof in response to a first clock signal, and voltage supply means connected to the one input of the selective output means for applying a predetermined level voltage to the one input.

According to the present invention, after the voltage supply mean connected to the input of the selective output means has brought the one input to a predetermined voltage level, the selective means switches in response to the first clock signal so as to apply the signal from the refresh counter means to the address buffer means. Therefore, the signal from the refresh counter means is correctly transmitted to the address buffer means, so that the address buffer means operates correctly.

According to the present invention, since the address buffer means operates correctly without malfunctioning, the reliability of the refresh operation can be enhanced.

In a preferred embodiment, the voltage supply means comprises voltage setting means for applying a voltage of the reference voltage point in response to a second clock signal. Before the selective output means applies the signal from the refresh counter means to the address buffer means, the voltage setting means applies the voltage of the reference voltage point to the address buffer means in response to the second clock signal. Consequently, malfunctions of the address buffer means can be prevented.

In another preferred embodiment, the voltage supply means comprises voltage changing means for changing the voltage level of the external address input to a predetermined voltage level. Before the selective output means applies the signal from the refresh counter means to the address buffer means, the voltage changing means converts the voltage of the external address input to a predetermined voltage level and applies the same to the address buffer means. Therefore, malfunctions of the address buffer means can be prevented.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
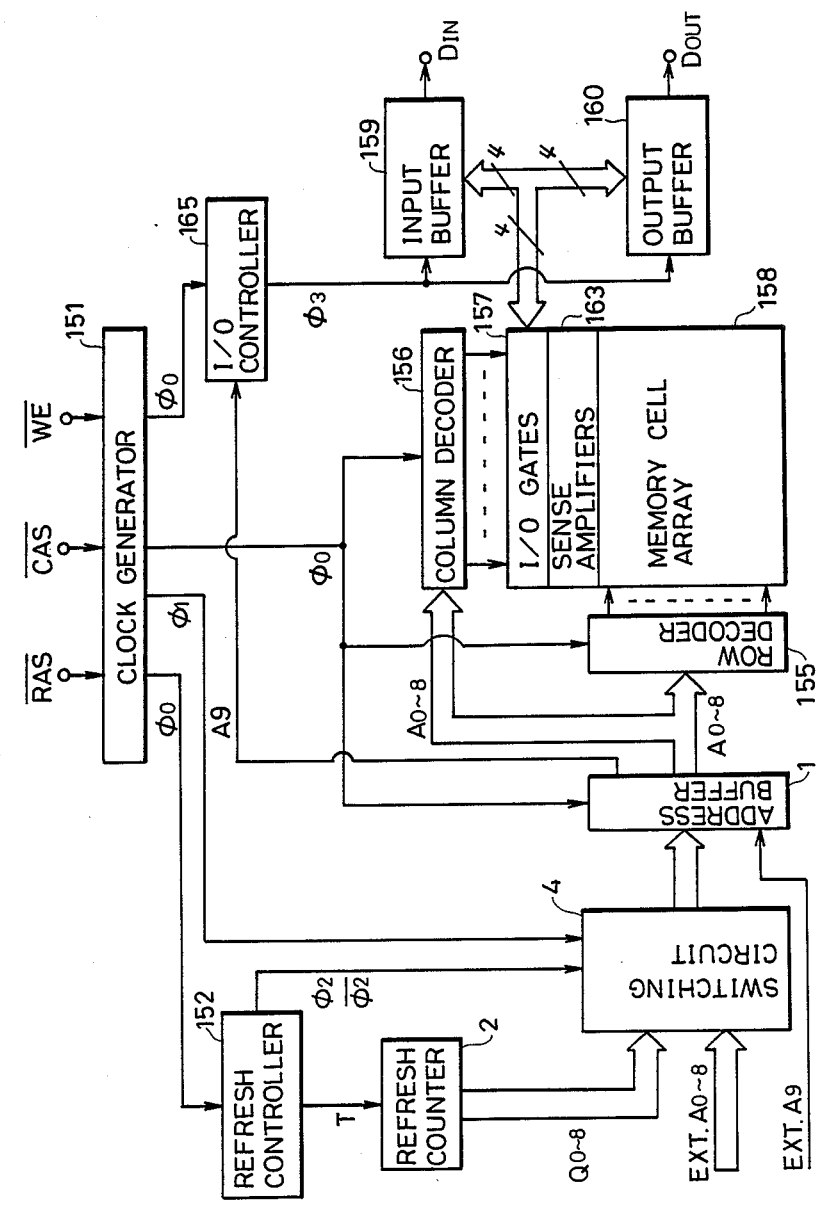
FIG. 1A is a schematic block diagram showing one example of the structure of a conventional dynamic RAM.
Figure 1B:
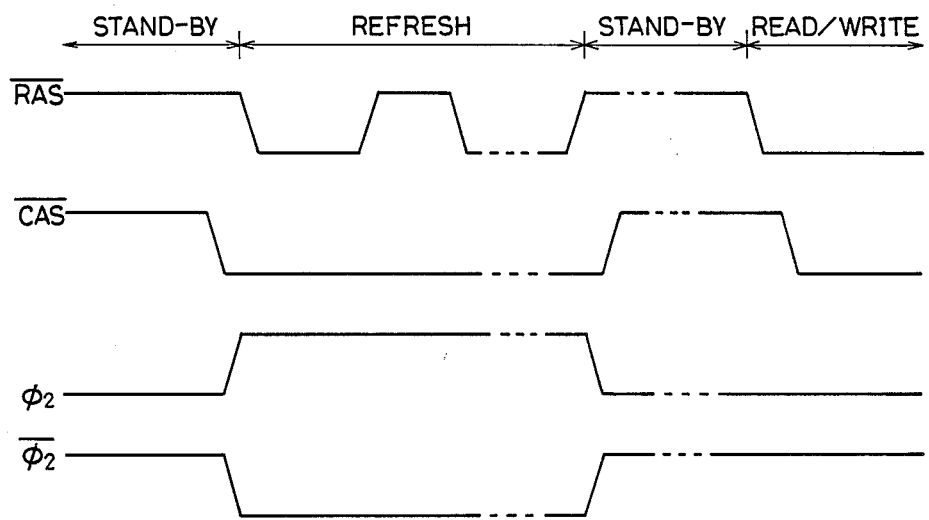
FIG. 1B is a timing chart showing the relation between main signals and the operation states of the dynamic RAM shown in FIG. 1A.
Figure 2B:
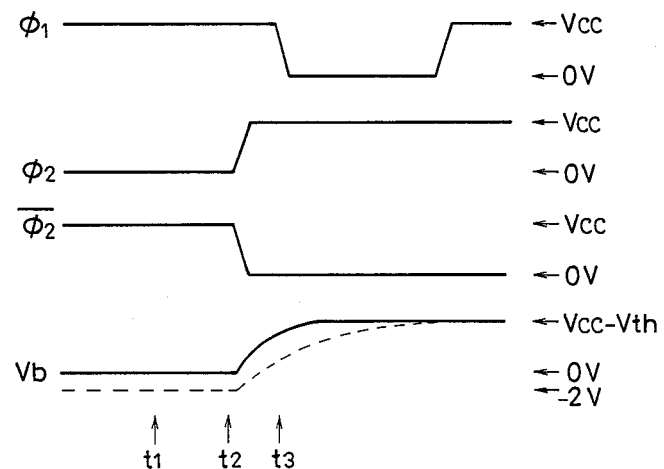
FIG. 2B is a timing chart of each of the signals for the description of the circuit shown in FIG. 2A.
Figure 2A:
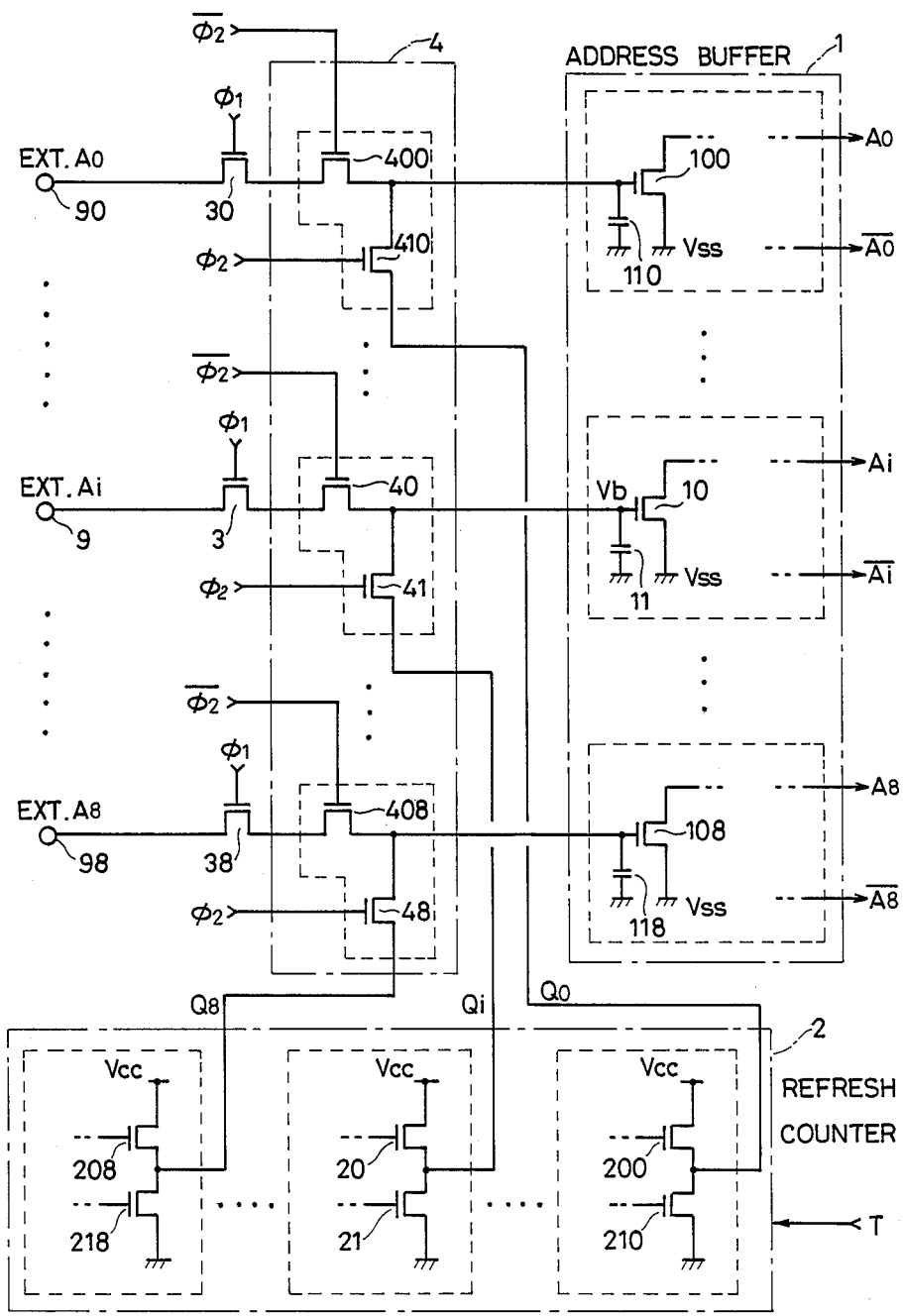
FIG. 2A is a schematic diagram showing the switching circuit and the peripheral circuits thereof in the conventional dynamic RAM shown in FIG. 1A.
Figure 3A:
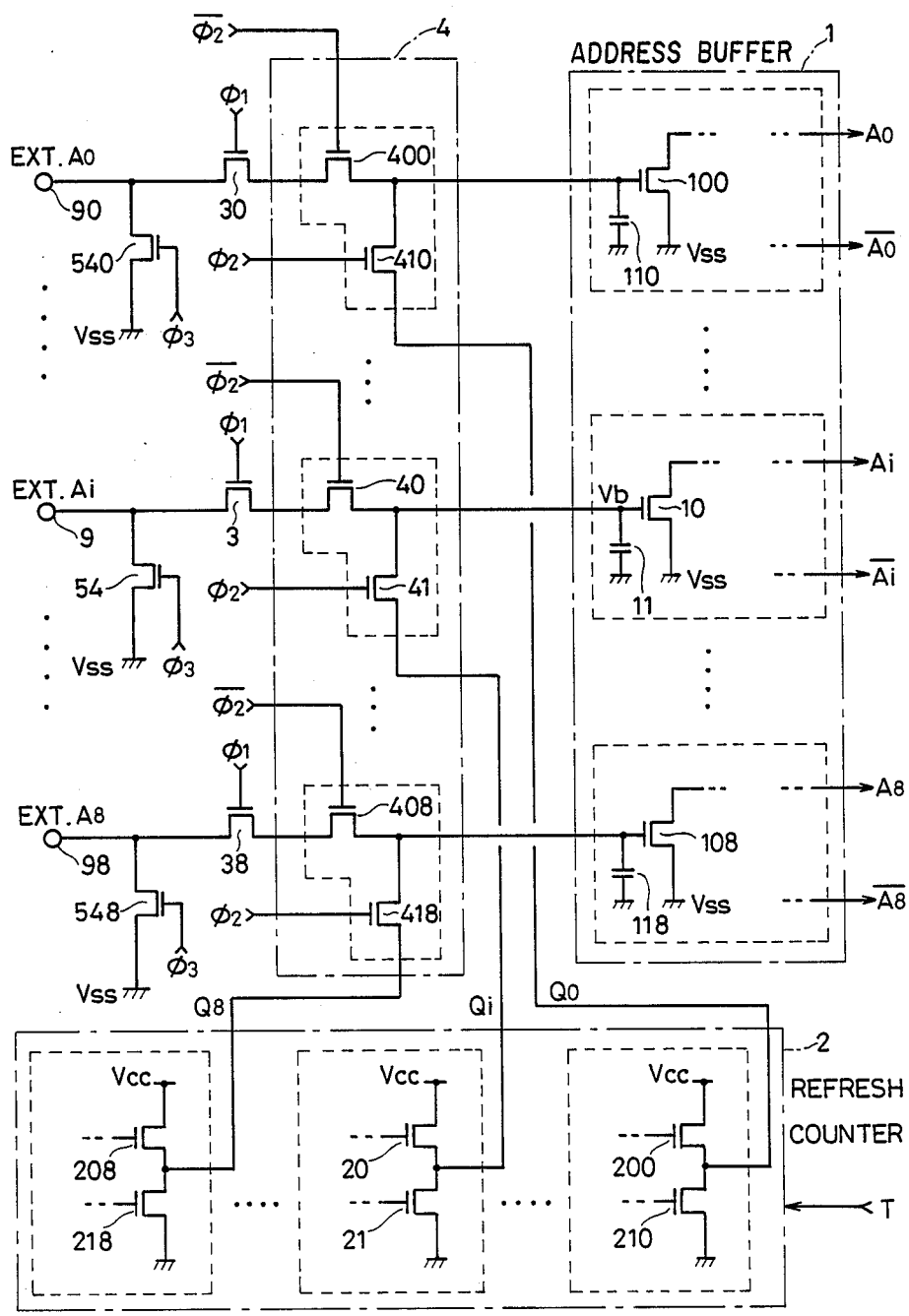
FIG. 3A is a schematic diagram of one embodiment of the switching circuit and the peripheral circuit thereof of the dynamic RAM in accordance with the present invention.

FIG. 3A is a schematic diagram showing one embodiment of the switching circuit and the peripheral circuit thereof in the dynamic RAM in accordance with the present invention. In the description of FIG. 3A, only the i-th circuit portion will be employed for the simplicity of the description, as in the case of FIG. 2A, and the description can be applied to other circuit portions.

Compared with the conventional circuit shown in FIG. 2A, the circuit shown in FIG. 3A further comprises an n type filed effect transistor 54 connected between the input of the transistor 3 and the ground $V_{ss}$, and a clock signal $\phi_3$ is applied to the gate of the transistor 54. The clock signal $\phi_3$ is almost in synchronization with the $\overline{RAS}$ signal and becomes H level during the standby period. Since other portions of the circuit of FIG. 3A are the same as the conventional circuit shown in FIG. 2A, and has been described above, the description thereof will not be repeated here.

Next, the operation will be described.

Figure 3B:
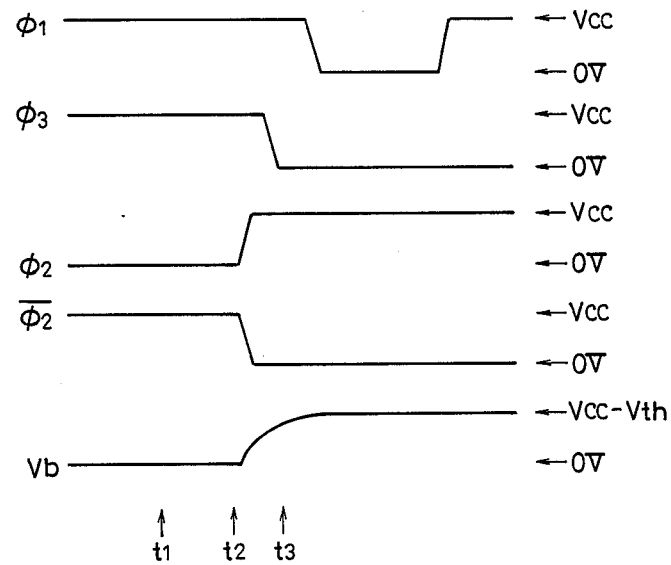
FIG. 3B is a timing chart of each of the signals employed in the description of the circuit shown in FIG. 3A.

FIG. 3B is a timing chart showing the changes in each of the signals in the circuit shown in FIG. 3A. Referring to FIG. 3B, at time $t_1$, the dynamic RAM is in the standby state. At time $t_1$, the clock signal $\phi_1$ is at the H level the clock signal $\phi_2$ is at the L level, the clock signal $\overline{\phi_2}$ is at the H level and the clock signal $\phi_3$ is at the H level. The transistor 54 turns on in response to the clock signal $\phi_3$ and brings the input of the transistor 3 to the voltage of the ground $V_{ss}$ level. Therefore, even if the input terminal 9 receives the external address signal EXT. Ai and is supplied with the voltage of, for example, $-2.0$ volt, the input of the address buffer 1 is brought to the voltage of the ground $V_{ss}$ level applied through the transistor 3 and the switching circuit 4, since the input of the transistor 3 is brought to the voltage of the ground $V_{ss}$ level.

At time $t_2$, the "$\overline{CAS}$ before $\overline{RAS}$ Refresh" state of the dynamic RAM begins. At time $t_2$, the clock signal $\phi_2$ changes to the H level while the clock signal $\overline{\phi_2}$ changes to the L level. The transistor 40 turns off in response to the clock signal $\overline{\phi_2}$ and the transistor 41 turns on in response to the clock signal $\phi_2$. As a result, the output signal $Q_i$ of the refresh counter 2 is applied to the input of the address buffer 1 through the transistor 41. When the output signal $Q_i$ of the refresh counter 2 has the voltage of H level, the input voltage $V_b$ of the address buffer rises (reference should be made to the waveform $V_b$ of FIG. 3B). At time $t_3$, the address buffer 1 begins the operation. Since a voltage of the ground Vss level is continuously applied to the input of the address buffer 1 by the transistor 54 until the time $t_2$, (namely, it is not the negative voltage level of, e.g. $-2.0$ volt), the input voltage $V_b$ of the address buffer 1 is surely brought to the value of approximately $V_b = V_{cc} - V_{th}$ at time $t_3$. Therefore, after the time $t_3$, the address buffer 1 operates correctly without malfunction.

In the circuit of FIG. 3A, although the transistor 54 is connected between the input of the transistor 3 and ground $V_{ss}$, one electrode of the transistor 54 may be connected to the power supply $V_{cc}$ instead of the ground $V_{ss}$ to obtain a similarly advantageous result.

Figure 4:
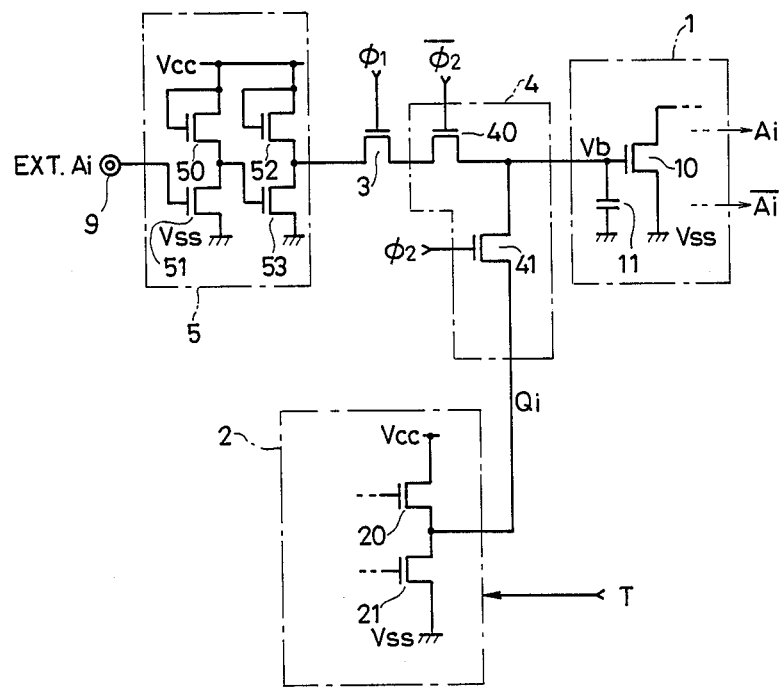
FIG. 4 is a part of a circuit diagram showing another embodiment of the switching circuit and the peripheral circuit thereof in the dynamic RAM in accordance with the present invention.

FIG. 4 is a partial circuit diagram showing another embodiment of the switching circuit and the peripheral circuit of the dynamic RAM of the present invention. The circuit diagram of FIG. 4 includes only the i-th circuit portion for simplicity. Compared with the i-th circuit portion of the conventional circuit shown in FIG. 2A, the circuit of FIG. 4 further comprises an inverter circuit 5 comprising two inverters connected between the input terminal 9 and the input of the transistor 3. The inverter circuit 5 is a voltage changing circuit for changing the voltage of the signal applied to the input terminal 9 to the voltage level of the power supply $V_{cc}$ or of the ground $V_{ss}$. The inverter of the preceding stage comprises a series connection of n type field effect transistors 50 and 51 connected between the power supply $V_{cc}$ and the ground $V_{ss}$. The inverter in the succeeding stage comprises a series connection of the n type field effect transistors 52 and 53 connected between the power supply $V_{cc}$ and the ground $V_{ss}$. The gates of the transistors 50 and 52 are both connected to the power supply $V_{cc}$. The gate of the transistor 51 is connected to the input terminal 9. The gate of the transistor 53 is connected to the node connected to the transistors 50 and 51. The node connected to the transistors 52 and 53 is connected to the input of the transistor 3.

Next, the operation will be described. The timing chart shown in FIG. 3B is again useful in describing operation of the circuit shown in FIG. 4.

At time $t_1$, the clock signal $\phi_1$ is at the H level, the clock signal $\bar{\phi}_2$ is at the L level and the clock signal $\phi_2$ is at the H level. The external address signal EXT. Ai is applied to the input of the address buffer 1 through the buffer circuit 5, transistor 3 and the switching circuit 4. Even if the input terminal 9 is brought to the voltage of, for example $-2.0$ volt upon receipt of the external address signal EXT. Ai, the inverter circuit 5 comprising two inverters outputs the voltage of the ground $V_{ss}$ level. Therefore, the input of the address buffer 1 is brought to the voltage of the ground $V_{ss}$ level applied through the transistor 3 and the switching circuit 4. The operation of the circuit shown in FIG. 4 after the time $t_2$ is the same as the operation of the circuit shown in FIG. 3A, and that description will not be repeated here. In the circuit of FIG. 4, the address buffer 1 operates correctly without malfunctions after the time $t_3$, as in the case of the circuit shown in FIG. 3A.

Although the inverter circuit 5 comprises a two-stage inverter in the circuit of FIG. 4, the same result will be brought about by a one-stage inverter. However, in the latter mentioned case, the inverted signal of the external address signal EXT. Ai is applied to the input of the address buffer 1.

Figure 5:
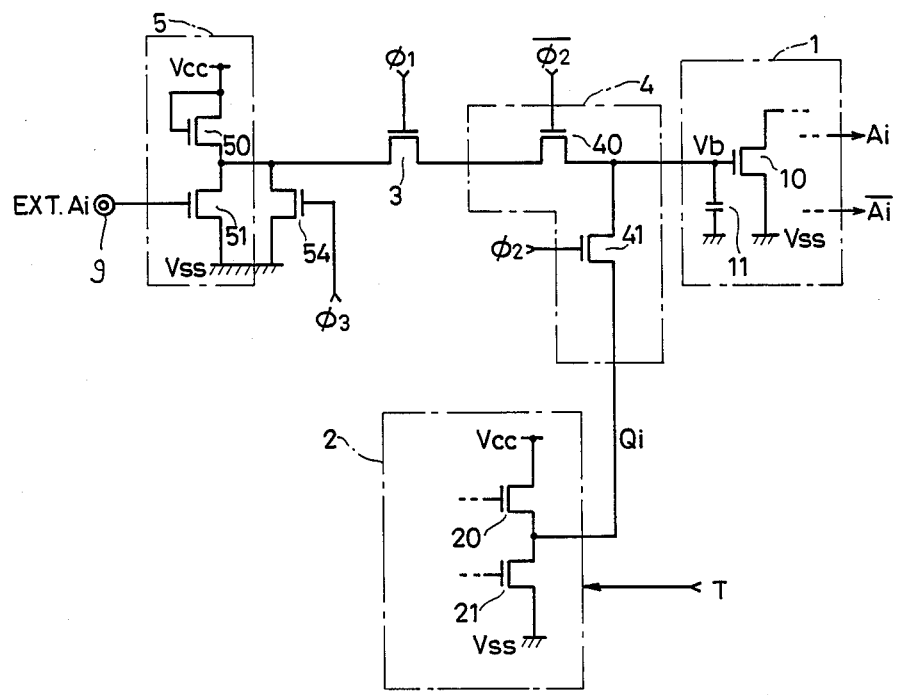
FIG. 5 is a part of the circuit diagram showing further embodiment of the switching circuit and a peripheral circuit thereof in the dynamic RAM in accordance with the present invention.

FIG. 5 shows a partial circuit diagram showing another embodiment of the switching circuit and the peripheral circuit of the dynamic RAM using these two inventions. Similar to FIG. 4, the circuit diagram of FIG. 5 comprises only the i-th circuit portion for simplicity.

Compared with the circuit shown in FIG. 3A, the circuit of FIG. 5 further comprises a one-stage inverter connected between the input terminal 9 and the input of the transistor 3. The inverter comprises a series connection of the n type field effect transistors 50 and 51 connected between the power supply $V_{cc}$ and the ground $V_{ss}$. The gate of the transistor 50 is connected to the power supply $V_{cc}$ and the gate of the transistor 51 is connected to the input terminal 9. The node connected to the transistors 50 and 51 is connected to the input of the transistor 3.

Since the operation of the circuit shown in FIG. 5 is the same as the operation of the circuits shown in FIGS. 3A and 4, the description thereof will not be repeated here. Malfunction of the address buffer 1 can be prevented in the circuit of FIG. 5, as in the circuits of FIGS. 3A and 4.

Figure 6:
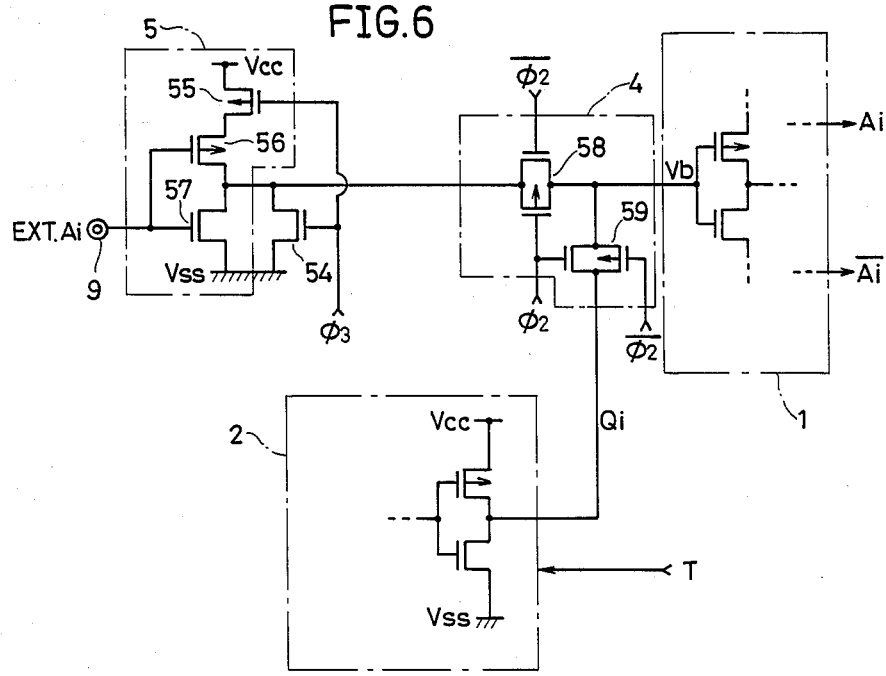
FIG. 6 is a part of the circuit diagram showing a further embodiment of the switching circuit and a peripheral circuit thereof in the dynamic RAM in accordance with the present invention.

FIG. 6 shows a partial circuit diagram showing a further embodiment of the switching circuit and the peripheral circuit of the dynamic RAM utilizing these two inventions. Compared with the circuit shown in FIG. 5, the circuit of FIG. 6 comprises complementary field effect transistors, and the switching circuit 4 comprises transmission gates 58 and 59 instead of the transistors 40 and 41. The inverter comprises a series connection of the p type field effect transistors 55 and 56 and the n type field effect transistor 57 connected between the power supply $V_{cc}$ and the ground $V_{ss}$. The clock signal $\phi_3$ is applied to the gate of the transistor 55. The gates of the transistors 56 and 57 are connected together to the input terminal 9. The node connected to the transistors 56 and 57 is connected to the input of the transistor 3. Since the address buffer 1 has the same function as the transistor 3 shown in FIG. 5, the transistor 3 is not necessary in the circuit of FIG. 6.

Malfunctions of the address buffer 1 can be prevented in the circuit of FIG. 6, as in the circuits of FIGS. 3A, 4 and 5.

As described above, the present invention comprises switching means for applying either the signals from the external address input or the signals from the refresh counter means to the address buffer means in response to the first clock signal and voltage supply means for applying the voltage of a predetermined level to the input of the switching means for receiving the signal from the external address input. Before the switching means applies the signal from the refresh counter means to the address buffer means, the voltage supply means applies the predetermined voltage to the address buffer means. Therefore, malfunction of the address buffer means can be prevented and the reliability of the refresh operation is enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device having refresh counter means for generating refresh signals for the internal refresh, comprising,
    an input for receiving an external address signal;
    clock generating means for generating a clock signal;
    selective output means having at least one input connected to receive a signal applied to said external address signal input and the other input connected to receive a refresh signal from said refresh counter means, and an output for selectively outputting at least one of the signal from said external address signal input and the signal from said refresh counter means in response to a first clock signal;
    address buffer means connected to an output of said selective output means;
    reference voltage supply means coupled to one of said at least one input and said output of said selective output means for supplying a voltage of a predetermined level to said one input of said selective output means.

2. A dynamic random access memory device according to claim 1, wherein said voltage supply means comprises voltage setting means connected between said one input of said selective output means and the reference voltage point of the voltage of said predetermined level, for setting said one input of said selective output means at the voltage level of said reference voltage point in response to a second clock signal and applying the same to said selective output means.

3. A dynamic random access memory device according to claim 2, wherein said voltage setting means comprises first switching means.

4. A dynamic random access memory device according to claim 3, wherein said first switching means comprises a first field effect device of a certain conductivity type having a control electrode connected to receive the second clock signal.

5. A dynamic random access memory device according to claim 1, wherein said voltage supply means comprises voltage changing means receiving a signal from said external address input for changing the voltage level of the signal to said predetermined voltage level and supplying the same to said selective output means.

6. A dynamic random access memory device according to claim 5, wherein said voltage changing means comprises inverter means.

7. A dynamic random access memory device according to claim 6, wherein said inverter means comprises a one-stage first inverter connection.

8. A dynamic random access memory device according to claim 7, wherein said first inverter connection comprises a first series connection of a third and fourth field effect device of a certain conductivity type connected between said power supply and the ground both having control electrodes, wherein
the control electrode of said third field effect device is connected to said power supply,
the control electrode of said fourth field effect device is connected to said external address input, and
a node connected between said third and fourth field effect devices constitutes the output of said first inverter connection.

9. A dynamic random access memory device according to claim 7, wherein said first inverter connection comprises a second series connection of the fifth and sixth field effect device of the opposite conductivity type and a seventh field effect device of a certain conductivity type connected between said power supply and the ground, both having control electrodes, wherein
the control electrode of said fifth field effect device is connected to receive a second clock signal,
control electrodes of said sixth and seventh field effect devices are both connected to said external address input, and
a node connected to said sixth and seventh field effect devices constitutes the output of said first inverter connection.

10. A dynamic random access memory device according to claim 6, wherein said inverter means comprises a two-stage second inverter connection.

11. A dynamic random access memory device according to claim 10, wherein said second inverter connection comprises
a third series connection of an eighth and ninth field effect devices of a certain conductivity type both having control electrodes, connected between said power supply and the ground, wherein
the control electrode of said eighth field effect device is connected to said power supply, and
the control electrode of said ninth field effect device is connected to said external address input; and
a fourth series connection of a tenth and eleventh field effect devices of a certain conductivity type both having control electrodes, connected between said power supply and the ground, wherein
the control electrode of said tenth field effect device is connected to said power supply,
the control electrode of said eleventh field effect device is connected to a node connected to said eighth and ninth field effect devices, and
a node connected to said tenth and eleventh field effect devices constitutes an output of said second inverter connection.

12. A dynamic random access memory device according to claim 1, wherein said voltage supply means comprises
voltage setting means connected between said one input of said selective output means and the reference voltage point of the voltage of said predetermined level for setting said one input of said selective output means at the voltage level of said reference voltage point and supplying the same to said selective output means, and
voltage changing means receiving a signal from said external address input for changing the voltage level of the signal to said predetermined voltage level and supplying the same to said selective output means.

13. A dynamic random access memory device according to claim 1, wherein said predetermined level comprises the voltage levels of the power supply and the ground.

14. A dynamic random access memory device according to claim 1, further comprising second switching means connected between said voltage supply means and said selective output means, which turns on in response to a third clock signal.

15. A dynamic random access memory device according to claim 14, wherein said second switching means comprises a second field effect device of a certain conductivity type having the control electrode connected to receive a third clock signal.

16. A dynamic random access memory device according to claim 1, wherein said switching means comprises
third switching means connected between said external address input and the input of said address buffer means, which turns on in response to a first clock signal, and
fourth switching means connected between the output of said refresh counter means and the input of said address buffer means, which turns on in response to a first clock signal.

17. A dynamic random access memory device according to claim 16, wherein said third switching means comprises first transmission gate means, and
said fourth switching means comprises second transmission gate means.

18. A dynamic random access memory device according to claim 16, wherein said third switching means comprises a twelfth field effect device of a certain conductivity type having the control electrode connected to receive a first clock signal, and
said fourth switching means comprises a thirteenth field effect device of a certain conductivity type having the control electrode connected to receive a first clock signal.

19. A dynamic random access memory device according to claim 18, wherein said certain conductivity type is n type and said opposite conductivity type is p type.

20. A dynamic random access memory as recited in claim 1, wherein said reference voltage supply means includes a logic level shifting means whereby the voltage difference between said input for receiving an external address and a response threshold of said address buffer means may be brought to a level less than a predetermined value.

21. A dynamic random access memory as recited in claim 20, wherein said logic level shifting means is a two stage inverter.

22. A dynamic random access memory as recited in claim 1, wherein said reference voltage supply means includes switching means connected to a reference voltage whereby the voltage difference between said input for receiving an external address and a response threshold of said address buffer means may be brought to a level less than a predetermined value.

23. A dynamic random access memory as recited in claim 22, wherein said reference voltage supply means further includes a single stage inverter the output of which is connected in parallel with said switching means.

24. A dynamic random access memory as recited in claim 23, wherein at least one of said single stage inverter and said selective output means are includes CMOS transistors.

25. A dynamic random access memory as recited in claim 24, wherein at least one CMOS transistor in said single stage inverter is connected to receive an input in common with said switching means.

26. In a dynamic random access memory providing internal refresh, having a circuit for receiving an external address signal on external address inputs, an address buffer means and a switching circuit for receiving at least one of
   (a) the output of said circuit for receiving an external address and
   (b) an address from a refresh counter, a method for improving the reliability of an internal refresh operation comprising the steps of
coupling a reference voltage source to at least one output of said circuit for receiving an external address prior to a refresh cycle;
thereafter, disconnecting said at least one output of said circuit for receiving an external address from said address buffer, and
applying said address from said refresh counter to said address buffer means
whereby the voltage difference between said output of said circuit for receiving an external address and a response threshold of said address buffer means may be brought to a level less than a predetermined value.

* * * * *

UNITED STATES PATENT AND TRADEMARK OFFICE
CERTIFICATE OF CORRECTION

PATENT NO. : 4,870,620

DATED : September 26, 1989

INVENTOR(S) : Yamagata et al.

It is certified that error appears in the above-identified patent and that said Letters Patent is hereby corrected as shown below:

In the ABSTRACT:

Line 4, change "$\phi 2$" (second occurrence) to --$\overline{\phi_2}$--.

Column 2, line 10, change "$\phi 2$" (second occurrence) to --$\overline{\phi_2}$--;

Column 2, line 42, change "$\phi 2$" (second occurrence) to --$\overline{\phi_2}$--;

Column 2, line 48, change "$\phi 2$" to --$\overline{\phi_2}$--;

Column 3, line 8, change "$\phi 2$" to --$\overline{\phi_2}$--; (1st occurrence)

Column 3, line 10, change "$\phi 2$" (second occurrence) to --$\overline{\phi_2}$--;

Column 3, line 27, change "$\phi 2$" (second occurrence) to --$\overline{\phi_2}$--;

UNITED STATES PATENT AND TRADEMARK OFFICE
CERTIFICATE OF CORRECTION

PATENT NO. : 4,870,620

DATED : September 26, 1989

INVENTOR(S) : Yamagata et al.

It is certified that error appears in the above-identified patent and that said Letters Patent is hereby corrected as shown below:

Column 3, line 36, change "$\phi 2$" to --$\overline{\phi_2}$--;

Column 3, line 44, change "$\phi 2$" (second occurrence) to --$\overline{\phi_2}$--;

Column 3, line 46, change "$\phi 2$" to --$\overline{\phi_2}$--;

Column 6, line 15, change "$\phi 2$" to --$\overline{\phi_2}$--;

Column 6, line 28, change "$\phi 2$" (second occurrence) to --$\overline{\phi_2}$--;

Column 6, line 30, change "$\phi 2$" to --$\overline{\phi_2}$--;

Column 7, line 14, change "$\phi 2$" (second occurrence) to --$\overline{\phi_2}$--.

Signed and Sealed this

First Day of June, 1993

*Attest:*

MICHAEL K. KIRK

*Attesting Officer*   Acting Commissioner of Patents and Trademarks